June 3, 1969 J. L. NAGLOWSKI ET AL 3,448,399
CIRCUIT OF A VACUUM-TUBE, A.C.-COUPLED AMPLIFIER OPERATING IN CONJUNCTION WITH SELECTIVE NEGATIVE FEED-BACK QUADRIPOLES
Filed Dec. 29, 1964
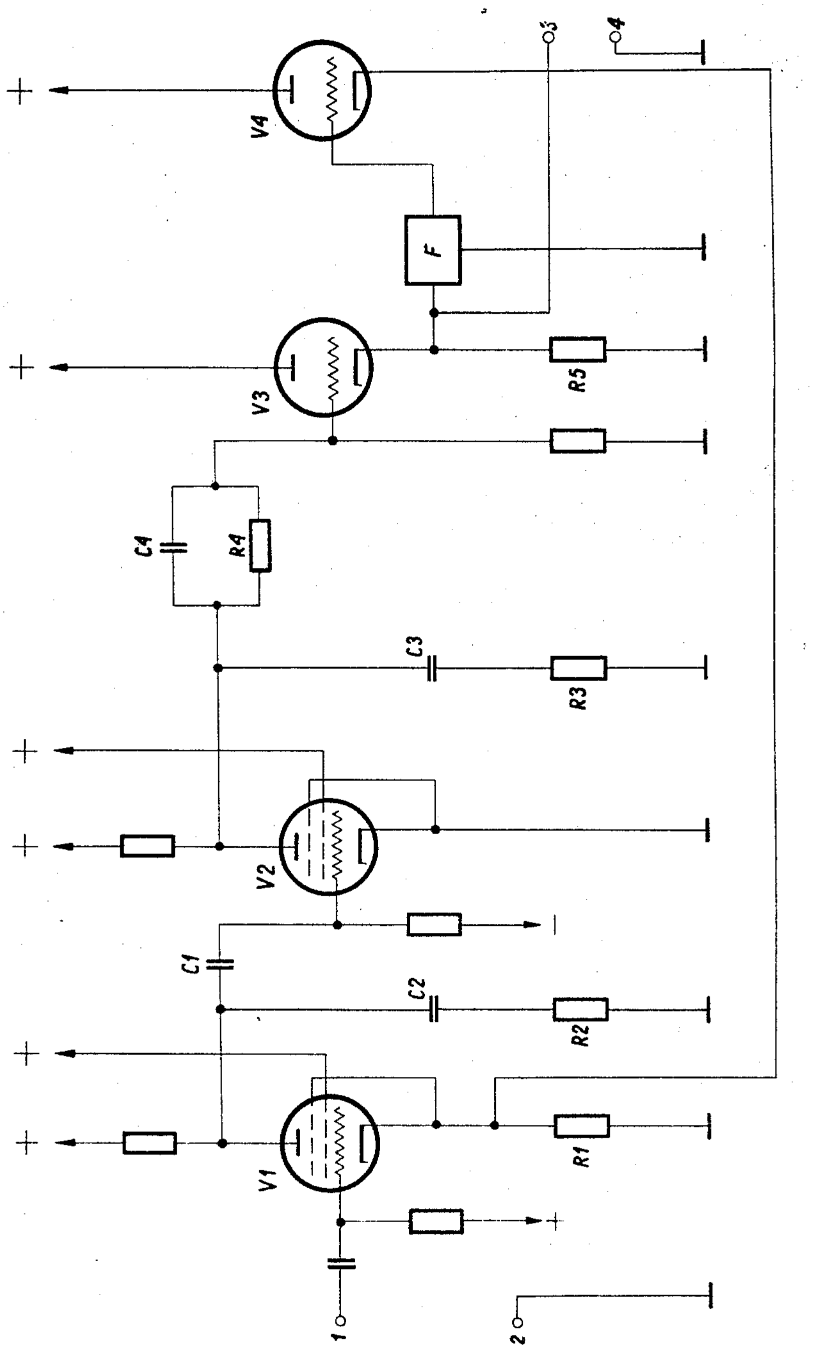

United States Patent Office 3,448,399
Patented June 3, 1969

3,448,399

CIRCUIT OF A VACUUM-TUBE, A.C.-COUPLED AMPLIFIER OPERATING IN CONJUNCTION WITH SELECTIVE NEGATIVE FEED-BACK QUADRIPOLES

Jerzy Leslaw Naglowski, Goszczynskiego-St. No. 36, Warsaw, Poland, and Marian Hoscilowicz, Stoleczna-St. No. 7, Warsaw, Poland Filed Dec. 29, 1964, Ser. No. 421,836
Claims priority, application Poland, Aug. 7, 1964, P 104,778
Int. Cl. H03f *1/22, 3/36*
U.S. Cl. 330—88 5 Claims

ABSTRACT OF THE DISCLOSURE

A frequency selective, negative feedback amplifier includes a frequency selective quadripole between the cathode of a cathode follower output stage and the control grid electrode of a cathode follower negative feedback stage, the cathode of which is coupled to the cathode of an input stage to share a common cathode resistor therewith.

The object of this invention is a circuit of a vacuum-tube, A.C.-coupled amplifier, destined to operate in conjunction with selective negative feedback quadripoles of bridging-type (for instance "twin T" resistance-capacitance networks or "bridged T" inductance-capacitance networks) as well as of non-bridging type (for example "bridged T" resistance-capacitance networks). The circuit is characterized by the possibility of providing very high gain of the feedback-loop at fully secured stability conditions. Most of the known circuits of selective amplifiers operating in conjunction with selective quadripoles—i.e., selective negative feedback filter networks—are based on bridging configurations, i.e., such networks where the negative feedback loop gain is equal to zero at the maximum-gain-frequency. However, there are many disadvantages in the use of bridging filters when applied to selective amplifiers with negative feedback.

A first difficulty is the impossibility of obtaining negative feedback at the "resonant" frequency, i.e., at the maximum-gain-frequency. Thus the over-all amplifier gain cannot be made stable at this frequency. This disadvantage can be avoided by employing for example two separate feedback loops—one selective and the other aperiodic—but this method leads toward a considerable circuit complication and a decrease of the circuit overall selectivity.

A further disadvantage is in the necessity of providing not only amplitude-balance but also phase-balance at the bridging filter's resonant frequency. Thus, great difficulties arise, particularly with tuned selective amplifiers; it requires very close tolerances for the fixed components and a perfectly equal tuning law for at least two variable components of the filter.

Both disadvantages can be avoided by employing non-bridging filters instead of the bridging filters. However, this results in much lower selectivity at the same amplifier open-loop gain in comparison with the bridging filters; to obtain, however, a selectivity equivalent to that of a bridging filter circuit the open-loop amplifier gain must be increased; this, in turn involves an increase of the negative feedback loop gain at both resonance curve sides rendering the amplifier stability problems critical. A detailed mathematical analysis of the bridging as well as non-bridging filters shows, that when employing each one of these filter configurations the negative feedback loop gain at both sides of the "resonant" curve is practically equal to the open-loop amplifier gain. This is because for A.C. signals with frequencies, distant enough from the "resonance" frequency, each of these filters is practically equivalent to a short-circuit of the amplifier input and output. It is evident that the amplifier phase shift within the amplifier passband should be close to 180°; however, the selective filter characteristics, mentioned above indicate, that each amplifier circuit designed to operate in conjunction with such filters must be stability-tested with its output short-circuited to the input.

The greater the open-loop amplifier gain, the greater will be the gain of the negative feedback loop when the amplifier output is short-circuited with its input, and the harder it is to obtain an absolute stability of the amplifier—i.e., such dimensioning of its amplitude and phase response, that no self-excitation at any of the frequencies arises.

As mentioned above, the application of non-bridging filters without loss of such amplifier selectivity, as would be possible in the case of bridging filters, requires the negative feedback loop gain to be increased, which in turn makes the amplifier stability problems more acute.

On the other hand, the application of non-bridging filters gives the advantages described in the first paragraph of this specification; an additional advantage is the practical independence of the circuit selectivity on the open-loop amplifier gain at the "resonant" frequency, provided the negative feedback loop gain at this frequency is adequately high. In such conditions, the circuit selectivity depends practically on the filter characteristics.

Thus, it seems profitable to design an amplifier circuit, in which the open-loop amplifier gain as well as the negative feedback loop gain with output short-circuited to input would be adequately high.

The amplifier circuit described below corresponds to this design and is the object of the invention. As shown on the circuit diagram, the amplifier consists of four amplification stages using the tubes V1, V2, V3, V4 respectively; for tubes V1 and V2 pentodes as well as triodes may be employed, while two separate triodes or one double triode can operate as tubes V3 and V4. The stages with tubes V1 and V2 are conventional resistance-coupled grounded-cathode amplifiers, while tubes V3 and V4 are arranged to form two cathode followers, the resistors R5 and R1 constituting the cathode load for tubes V3 and V4, respectively. The negative feedback signal is developed across the resistor R1. The input of the frequency-dependent, negative-feedback quadripole formed by the filter F is fed directly from the cathode of tube V3. The filter output is fed directly to the control grid of tube V4; the cathode circuit of the latter tube V4 is coupled by means of a common cathode resistor R1 to the amplifier's input stage. Capacitor C1 is used for coupling the plate of tube V1 to the grid of tube V2, while a parallel combination of capacitor C4 and resistor R4 couples the plate of tube V2 to the grid of tube V3; these components are responsible for such a shape of the phase response at the lower limit frequency that no oscillation is possible to occur. The following RC series combinations have a similar function at the higher limit frequency: R2–C2 inserted into the plate load circuit of tube V1 and R3–C3 inserted into the plate load circuit of tube V2.

The input signal is applied to the unbalanced circuit across terminals 1 and 2 and from there it reaches the control grid of tube V1; the output signal is developed across the cathode resistor R5 of the tube V3 and is accessible at unbalanced output terminals 3, 4.

To check the absolute stability of the circuit according to the invention when cooperating with any selective filter F of the negative feedback, tuned to any frequency of the frequency range in question it is only necessary to short-circuit the control grid of tube V4 to the cathode of tube V3. In this way, the amplifier output will be short-circuited to its input, representing the condition of maximum negative feedback loop gain, the latter being equivalent to the open-loop amplifier gain.

What we claim is:

1. A frequency selective vacuum tube amplifier circuit comprising an input stage, an output stage, and a negative feedback stage;

said output stage comprising a cathode follower having a control electrode and a cathode electrode;

coupling means coupling said anode of said input stage to said control electrode of said output stage;

said negative feedback stage including an amplifying device having a control grid electrode and a cathode;

a frequency selective quadripole connected between said cathode electrode of said output stage and said control grid electrode of said negative feedback stage; and a common cathode resistor having one end connected to the cathode of said input stage and the cathode of said negative feedback stage and another end connected to a point of reference potential.

2. An amplifier as recited in claim 1, wherein said coupling means includes means for shaping the phase response of said amplifier at its higher limit frequency to prevent oscillations from occurring.

3. An amplifier as recited in claim 2, wherein said means for shaping the phase response of said amplifier comprises a resistor and capacitor connected in series between said anode of said input stage and a point of reference potential.

4. An amplifier as recited in claim 1, wherein said coupling means includes means for shaping the phase response of said amplifier at its lower limit frequency to prevent oscillations from occurring.

5. An amplifier as recited in claim 4, wherein said coupling means comprises an intermediate amplifying stage coupled between said input stage and said means for shaping the phase response of said amplifier, said means for shaping the phase response of said amplifier comprising a resistor and capacitor in parallel connected between said intermediate stage and the control grid of said output stage.

References Cited

UNITED STATES PATENTS 2,886,659 5/1959 Schroeder ---------- 330—85

NATHAN KAUFMAN, *Primary Examiner.*

U.S. Cl. X.R.

330—152, 173